United States Patent
Yajima et al.

(10) Patent No.: US 9,040,353 B2
(45) Date of Patent: May 26, 2015

(54) METHOD FOR MANUFACTURING SEMICONDUCTOR LIGHT EMITTING DEVICE

(71) Applicant: Toyoda Gosei Co., LTD., Kiyosu-shi (JP)

(72) Inventors: Takayoshi Yajima, Kiyosu (JP); Hiroshi Ito, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 13/957,289

(22) Filed: Aug. 1, 2013

(65) Prior Publication Data

US 2014/0080235 A1    Mar. 20, 2014

(30) Foreign Application Priority Data

Sep. 18, 2012  (JP) .................................. 2012-204112
Mar. 21, 2013  (JP) .................................. 2013-057534

(51) Int. Cl.
| | | |
|---|---|---|
| *H01L 21/44* | (2006.01) | |
| *H01L 33/50* | (2010.01) | |
| *H01L 33/22* | (2010.01) | |
| *H01L 33/48* | (2010.01) | |
| *H01L 33/64* | (2010.01) | |

(52) U.S. Cl.
CPC .............. *H01L 33/50* (2013.01); *H01L 33/508* (2013.01); *H01L 33/22* (2013.01); *H01L 33/486* (2013.01); *H01L 33/505* (2013.01); *H01L 33/644* (2013.01); *H01L 2933/0033* (2013.01); *H01L 2924/0002* (2013.01)

(58) Field of Classification Search
CPC ....... H01L 33/22; H01L 33/38; H01L 33/502; H01L 33/505; H01L 33/508
USPC ............... 438/112, 124; 257/98, 99, E33.034
See application file for complete search history.

(56) References Cited

U.S. PATENT DOCUMENTS

| | | | |
|---|---|---|---|
| 8,330,182 B2 | 12/2012 | Suenaga | |
| 2005/0045903 A1* | 3/2005 | Abe et al. ..................... | 257/100 |
| 2010/0264438 A1 | 10/2010 | Suenaga | |
| 2012/0138974 A1 | 6/2012 | Yoo et al. | |
| 2012/0146077 A1 | 6/2012 | Nakatsu et al. | |
| 2013/0056781 A1 | 3/2013 | Suenaga | |

FOREIGN PATENT DOCUMENTS

| | | |
|---|---|---|
| JP | 2010-157638 A | 7/2010 |
| JP | 2010-272847 A | 12/2010 |
| JP | 2012-069645 A | 4/2012 |
| JP | 2012-124485 A | 6/2012 |
| WO | WO 2011/021402 A1 | 2/2011 |

* cited by examiner

*Primary Examiner* — Brett Feeney
*Assistant Examiner* — Pamela E Perkins
(74) *Attorney, Agent, or Firm* — McGinn IP Law Group, PLLC

(57) ABSTRACT

A method for manufacturing a semiconductor light emitting device comprises a sealing step of sealing a semiconductor chip fixed on a lead frame with a sealing member, a removal step of removing the sealing member until a surface of the semiconductor chip becomes exposed, an irregularity formation step of forming fine irregularities on a bond surface formed in the removal step, and a bonding step of bonding a wavelength conversion member to the bond surface.

9 Claims, 4 Drawing Sheets

METHOD FOR MANUFACTURING SEMICONDUCTOR LIGHT EMITTING DEVICE

BACKGROUND OF THE INVENTION

1. Field of the Invention

The invention relates to a method for manufacturing a semiconductor light emitting device and, particularly, a method for manufacturing a package.

2. Description of the Related Art

Various proposals have been made in connection with a method for manufacturing a semiconductor light emitting device. For instance, JP-A-2010-157638 describes a configuration in which an adhesive is applied over a light emitting element (a member corresponding to a semiconductor chip in the invention) fixed on a wiring board (a member corresponding to a lead frame of the invention) and subsequently a light transmission member (a member corresponding to a wavelength conversion member of the invention) that contains a phosphor and that has been formed in the form of a plate in advance is bonded to the light emitting element). JP-A-2012-124485 also describes a configuration in which a wavelength conversion layer (a member corresponding to a wavelength conversion member of the invention) including a phosphor is formed into a plate shape and applied with an adhesive and in which a light emitting element is bonded to the wavelength conversion layer.

However, in the case of a product that is required to generate a large amount of light and exhibit high directivity of luminous flux, like a head light of an automobile, if heat developed in a semiconductor chip or a phosphor is not sufficiently dissipated, it is conceivable that a bond between the semiconductor chip and the plate-like wavelength conversion member including a phosphor will peel off and that light emitting performance of the product will drop by the influence of peel-off of the wavelength conversion member. In light of such a concern, the invention proposes a manufacturing method for enhancing adhesion between the semiconductor chip and the plate-like wavelength conversion member.

SUMMARY OF THE INVENTION

The invention is directed toward a method for manufacturing a semiconductor light emitting device, comprising a sealing step of sealing a semiconductor chip fixed on a lead frame with a sealing member; a removal step of removing the sealing member until a surface of the semiconductor chip becomes exposed; an irregularity formation step of forming fine irregularities on a bond surface formed in the removal step; and a bonding step of bonding a wavelength conversion member to the bond surface.

In relation to the method for manufacturing a semiconductor light emitting device, it is desirable that the removal step should also double as the irregularity formation step.

In relation to the method for manufacturing a semiconductor light emitting device, it is desirable that a removing technique employed in the removal step should be grinding.

Moreover, in relation to the method for manufacturing a semiconductor light emitting device, it is desirable that the bond surface should be ground in a plurality of directions in the irregularity formation step.

In comparison with the manufacturing methods described in connection with JP-A-2010-157638 and JP-A-2012-124485, under the method for manufacturing a semiconductor light emitting device of the invention, the wavelength conversion member covers the semiconductor chip and extends up to the region of the sealing member. Hence, an area coated with the adhesive (i.e., the contact area) increases, whereby adhesion between the bond surface, which is made up of the semiconductor chip and the sealing member, and the wavelength conversion member is enhanced (i.e., the wavelength conversion member becomes less likely to peel off). Further, dissipation of heat developing in a fluorescent body is also enhanced.

Further, the bond surface is roughened by formation of fine irregularities, whereby a substantial increase arises in the area coated with the adhesive (i.e., the contact area (surface area)). Adhesion is thereby enhanced further. Further, dissipation of heat developing in a fluorescence substance is also enhanced.

Further, the wavelength conversion member is bonded in the area of the sealing member through which heat hardly travels. Therefore, degradation of the adhesive, which would otherwise be caused by heat in that area, is inhibited. Even if only the semiconductor chip in the bond surface peels off from an interface between the bond surface and the wavelength conversion member under thermal influence, the wavelength conversion member will be held by bonding action effected by the area of the sealing member. A drop in light emission performance is correspondingly inhibited.

Moreover, as a result of the bond surface being roughened, light, which would other travel toward the inside of the semiconductor chip upon reflection on the interface with the roughened surface, is blocked, whereby efficiency in extraction of light to the outside of the semiconductor chip is enhanced.

Further, the sealing member can double also as a housing (package) of the semiconductor light emitting device. An extra step of inserting an assembly which is made up of a semiconductor chip and a wavelength conversion member into a housing can be omitted, so that the cost of manufacture of the semiconductor light emitting device can be reduced.

Under the method for manufacturing a semiconductor light emitting device of the invention, processing pertinent to the removal step doubles as process pertinent to the irregularity formation step. Hence, labor which will be incurred by switching a stage from the removal step to the irregularity formation step can be omitted. Further, since the steps can be simplified, the cost of manufacture of the semiconductor light emitting device is held down.

Moreover, under the method for manufacturing a semiconductor light emitting device of the invention, a removing technique employed in the removal step is grinding. Hence, the removing technique is less expensive than other removing techniques; for instance, dicing involving use of irradiation of a laser beam, whereby the cost of manufacture of the semiconductor light emitting device is held down.

Further, under the method for manufacturing a semiconductor light emitting device of the invention, the bond surface is ground in a plurality of directions in the irregularity formation step, whereby fine irregularities are formed more reliably.

DESCRIPTION OF THE PREFERRED EMBODIMENTS

Embodiments of the invention are hereunder described by reference to the drawings. A semiconductor light emitting device manufactured by flip chip bonding is taken as an example in the embodiments, and explanations are hereinbelow given to a configuration of the device and a method for manufacturing the device. All drawings are schematically drawn in order to make the configuration of the semiconductor light emitting device and the method for manufacturing the semiconductor light emitting device clearly understandable.

(First Embodiment)

The configuration of a semiconductor light emitting device 10 of the first embodiment is first described.

(Entirety of the Semiconductor Light Emitting Device 10)

Figure 1:
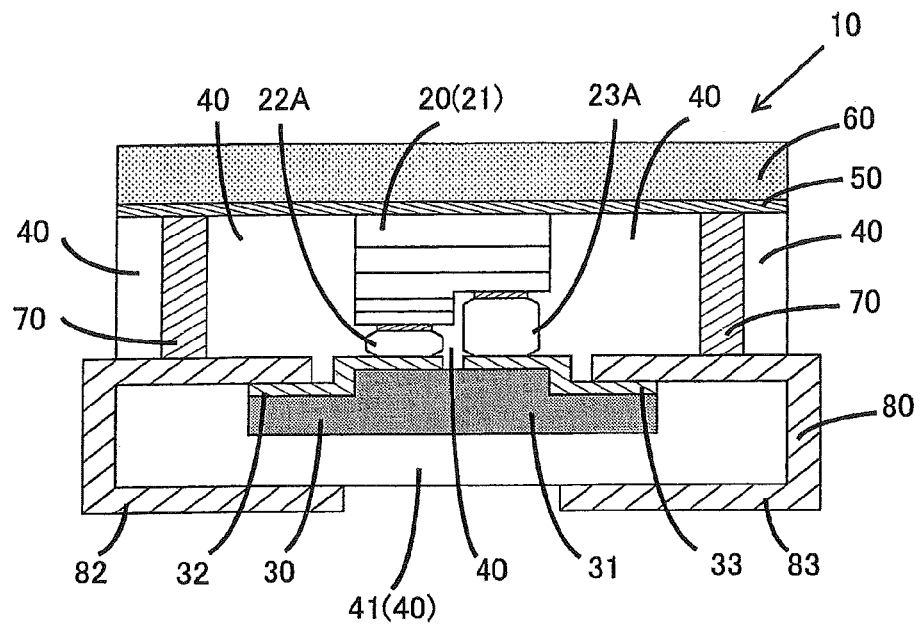
FIG. 1 is a cross sectional view of a semiconductor light emitting device manufactured by the invention (a first embodiment)

As shown in FIG. 1, the semiconductor light emitting device 10 is made up of a semiconductor chip 20, a sub-mounted substrate 30, a sealing member 40, a coupling member 50, a wavelength conversion member 60, a heat transfer member 70, and a lead frame 80.

(Semiconductor Chip 20)

Figure 2:
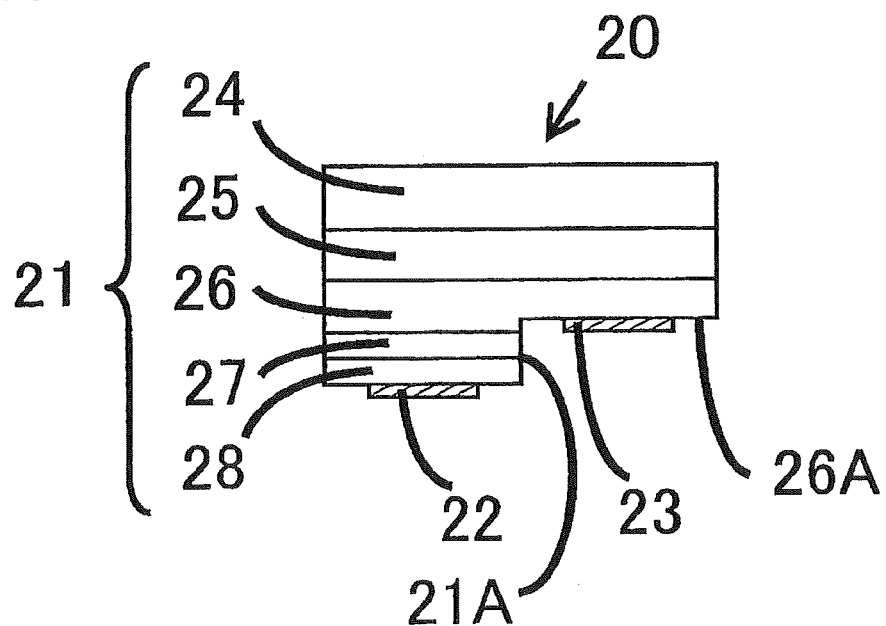
FIG. 2 is a cross sectional view of a semiconductor chip in the semiconductor light emitting device shown in FIG. 1 (the first embodiment)

As shown in FIG. 2, the semiconductor chip 20 is made up of a chip body 21, a p-electrode 22, and an n-electrode 23. The chip body 21 includes a substrate 24, a buffer layer 25, an n-type contact layer 26, a light emitting layer 27, and a p-type contact layer 28. The substrate 24 is made of sapphire, gallium nitride (GaN). From the viewpoint of thermal conductivity (heat dissipation), use of gallium nitride is desirable for flip chip bonding. The buffer layer 25, the n-type contact layer 26, the light emitting layer 27, the p-type contact layer 28, and the p-electrode 22 are stacked in this sequence on the substrate 24 by use of metal organic chemical vapor deposition (MOCVD), or the like. Next, the n-type contact layer 26, the light emitting layer 27, and the p-type contact layer 28, and the p-electrode 22 are partially etched away, to thus create a notch 21A, and a plane 26A to be used for creating the n-electrode 23 is formed in the n-type contact layer 26. Subsequently, the n-electrode 23 is fabricated on the plane 26A by sputtering or vacuum deposition, thereby completing one chip body 21. The chip body 21 is obtained by slicing into pieces a single wafer (i.e., the yet-to-be-sliced substrate 24) on which a plurality of chip bodies 21 are simultaneously fabricated. The configuration of the chip body 21 and the method for manufacturing the chip body 21 are common typical examples, and the chip body 21 is not particularly limited to the configuration and the manufacturing method.

(Sub-Mounted Substrate 30)

The sub-mounted substrate 30 is one to be used when the semiconductor chip 20 is implemented on the lead frame 80 to be described later. A substrate body 31 is a convex member made up of a material that exhibits high insulation and whose surface can be metalized, like glass-contained epoxy or ceramic. A p-electrode wiring pattern 32 and an n-electrode wiring pattern 33 are laid on the convex surface. In a page space of FIG. 1, the p-electrode wiring pattern 32 and the n-electrode wiring pattern 33 are separated from each other on an upper side of the convex of the substrate body 31 such that an electrical short-circuit does not occur. In the upper side of the convex of the substrate body 31, the p-electrode wiring pattern 32 is bonded to the p-electrode 22 of the semiconductor chip 20 by way of a conductive member 22A. Further, the n-electrode wiring pattern 33 in the upper side of the convex of the substrate body 31 is bonded to the n-electrode 23 of the semiconductor chip 20 by way of a conductive member 23A. The semiconductor chip 20 is thereby arranged (mounted) on the sub-mounted substrate 30. The mounting method is a method so-called flip chip bonding. The conductive member 22A and the conductive member 23A are so-called bumps, and gold or an alloy made of gold and tin is used for the bumps. In this respect, various specifications, including a shape, have already been put forth in connection with the sub-mounted substrate 30. The sub-mounted substrate 30 is not limited to that mentioned above. For instance, a configuration embodied by miniaturization of a substrate 30A to be described later can also be adopted. Further, there can also be adopted a configuration from which the sub-mounted substrate 30 is omitted, so long as the semiconductor chip 20 can be implemented directly on the lead frame 80.

(Sealing Member 40)

The sealing member 40 is a member that is formed so as to encompass the overall side surfaces of the chip body 21, to thus reflect light emitted from the side surfaces, or the like, of the chip body 21 toward the chip body 21. To this end, the sealing member 40 is preferably a white member. In the first embodiment, there is used a thermosetting white resin made by letting a transparent silicone resin, which is a thermosetting resin, contain a titanium oxide for whitening purpose (a particle diameter ranging from 0.1 micrometer to 50 micrometers) or silica (from a particle diameter of 5 nm to a particle diameter of less than 20 nm). However, the material of the sealing member is not limited to this. It is also possible to appropriately use a white ceramic paste and a member that contains a mixture of a white powder and a glass paste used for firing a vehicle base at a low temperate as well as another thermosetting white resin (e.g., a mixture of an epoxy resin and an additive for whitening, such as that mentioned above) and a white thermoplastic resin (e.g., a polyphthalic amid resin, a polycyclohexane dimethylene terephthalate resin, and the like). When the thermosetting resin is adopted, mixing the thermosetting resin with glass is preferable from the viewpoint of enhancement of heat resistance and cure strength. The sealing member 40 is also required to be an electrically insulating material.

(Coupling Member 50)

The coupling member 50 is a member for bonding the wavelength conversion member 60 to be described later to a bond surface that is made up of the substrate 24 of the semiconductor chip 20 and the sealing member 40. Although a silicone-based transparent adhesive containing fillers is used in the first embodiment, a transparent glass paste for low temperature sintering purpose can also be used. Using a material that exhibits a superior heat transfer characteristic for the coupling member 50 is also desirable.

(Wavelength Conversion Member 60)

The wavelength conversion member 60 is a member for converting light (primarily blue light) emanating from the semiconductor chip 20 into white light. A phosphor resin plate that is produced from transparent silicone by means of chromaticity control is used in the first embodiment. However, a plate-like (or a sheet-like) member produced from a sintered compact of phosphor-containing ceramics, a plate-like (or sheet-like) member made of glass containing phosphors, or the like, can also be used. As in the case with a bond surface 11, a surface of the wavelength conversion member 60 that is bonded to the bond surface 11 to be described later can also be machined in advance so as to have fine irregularities. If fine irregularities are formed also in the wavelength conversion member 60 in advance, the irregularities will contribute to enhancing performance for extracting light from an upper surface (a surface facing the bond surface 11) of the semiconductor chip 20 as well as to enhancing adhesion of the wavelength conversion member 60 to the bond surface 11. A phosphor can be arbitrarily selected, so long as the phosphor finally converts light into white light according to a wavelength of the light emanating from the semiconductor chip 20. The semiconductor chip 20 emanates blue light in the first embodiment, and a phosphor that converts blue light into yellow light is adopted. White light is produced by mixing yellow light with the blue light. When the semiconductor chip 20 emanates UV light (UV radiation), white light is produced by use of a plurality of types of phosphors (e.g., RGB phosphors). In addition to the phosphor, particles that exhibit a high heat transfer characteristic (in other words, particles that exhibit high thermal conductivity) can also be included in the wavelength conversion member 60. Alternatively, phosphor-containing ceramic particles that exhibit high thermal conductivity can also be included in the wavelength conversion member 60. Raw materials for these particles that exhibit the high heat transfer characteristic include aluminum nitride (AlN), gallium nitride (GaN), silicon carbide (SiC), diamond, and others. The particles that exhibit a high heat transfer characteristic are desired to exhibit high transparency with respect to a wavelength of light emanating from the semiconductor chip 20. Accordingly, in the case of silicon carbide, a band gap varies according to a crystalline structure. Therefore, when transparency to the wavelength of light is taken into account, accordingly selecting a crystalline structure, such as 4H—SiC or 6H—SiC, is desirable. Such particles that exhibit a high heat transfer characteristic are included in the wavelength conversion member 60, whereby heat propagates more efficiently from the wavelength conversion member 60 to the heat transfer member 70 to be described later. The first embodiment provides explanations about a case where the semiconductor light emitting device 10 emanates white light. However, when another color of light is emanated, the essential requirement is to perform adjustment by use of a desirable phosphor, as required.

(Heat Transfer Member 70)

Figure 8:
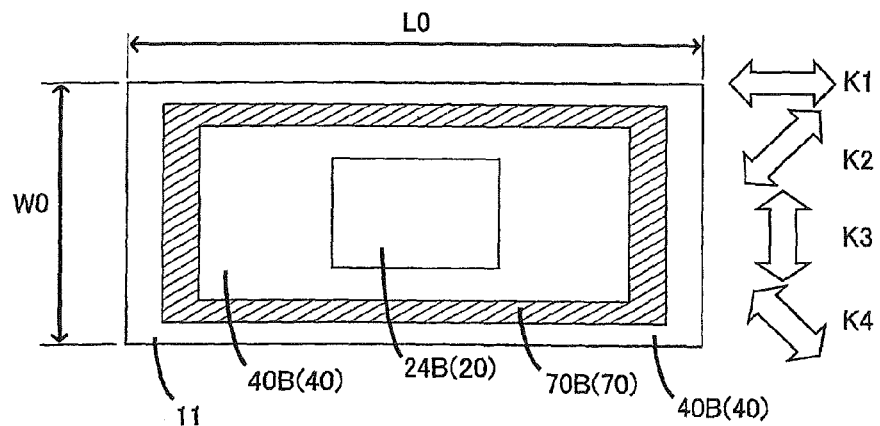
FIG. 8 is a plan view of the semiconductor light emitting device in the removal step shown in FIG. 4 that is captured when viewed from above (the first embodiment).

The heat transfer member 70 is a member for inhibiting local existence of heat by letting heat which develops when the wavelength conversion member 60 converts a wavelength of light, and heat transferred from the semiconductor chip 20 to the wavelength conversion member 60 escape to the lead frame 80. As shown in FIG. 8, the heat transfer member assumes a rectangularly annular shape so as to encompass the semiconductor chip 20. FIG. 8 is a plan view of the semiconductor light emitting device that is viewed from above (i.e., a direction designated by arrow P) in the removal step shown in FIG. 4. Degradation of the adhesive, or the coupling member 50, which would otherwise be caused by heat, is prevented by dissipation of heat from the lead frame 80 by way of the heat transfer member 70. As a consequence, degradation of adhesion of the wavelength conversion member 60 to the bond surface 11 is also inhibited, and hence the wavelength conversion member 60 becomes less likely to peel off. The heat transfer member 70 is connected to the wavelength conversion member 60 by way of the coupling member 50 and also to the lead frame 80. In the meantime, the other portion of the heat transfer member 70 is encompassed by the sealing member 40. When attention is paid solely to heat transfer, bringing the heat transfer member 70 into direct contact with the semiconductor chip 20 is also effective. However, from the viewpoint of inhibiting light emanating from the semiconductor chip 20 from being absorbed by members that make up the semiconductor light emitting device 10 and efficiently extracting light, the first embodiment adopts a configuration in which the sealing member 40 is interposed between the heat transfer member 70 and the semiconductor chip 20. In the first embodiment, although the heat transfer member 70 is encompassed by the sealing member 40, there can also be adopted a configuration in which a portion of the heat transfer member 70 is laid exposed out of the sealing member 40 and an exterior surface of the semiconductor light emitting device 10, thereby dissipating heat outside from the semiconductor light emitting device 10. Although carbon (C) is used as a material of the heat transfer member 70 in the first embodiment, the material is not limited to metals, like copper, aluminum, iron, gold, platinum, and silver. In other words, the material is not susceptible to particular limitations and can be a heat transfer member containing nitride particles, like aluminum nitrides (AlN) and gallium nitrides (GaN), and ceramic particles as well as a material that exhibits a superior heat transfer characteristic and high heat conductivity, such as silicon and diamond, and a heat transfer member containing particles of the material. Alternatively, when influence of heat is comparatively low, the heat transfer member 70 can also be omitted from the semiconductor light emitting device 10. Further, although the heat transfer member 70 assumes a rectangularly annular shape so as to encompass the semiconductor chip 20 in the first embodiment, the heat transfer member can also be changed to an arbitrary shape, like a circular shape and an oval shape, so long as a desirable heat dissipation characteristic is exhibited. In addition, the heat transfer member 70 can also be provided intermittently rather than being laid in a continual annular shape.

(Lead Frame 80)

The lead frame 80 is a plate-like member made from a conductive material that exhibits a superior heat dissipation characteristic, like a copper alloy and an iron alloy. A portion of the lead frame 80 is laid exposed out of the exterior surface of the semiconductor light emitting device 10, to thus dissipate heat directly to the outside of the semiconductor light emitting device 10. A lead frame that takes copper as base metal and whose surface is plated with silver is employed as the lead frame 80 of the first embodiment. The lead frame 80 is made up of two lead frames; namely, a p-electrode-side lead frame 82 to be bonded to the p-electrode wiring pattern 32 of the sub-mounted substrate 30 and an n-electrode lead frame 83 to be bonded to the n-electrode-side wiring pattern 33 of the sub-mounted substrate 30. The p-electrode-side lead frame 82 and the n-electrode-side lead frame 83 are separated from each other so as to avoid electrical conduction. An un-illustrated conductive adhesive (e.g., solder made of an alloy including gold and tin, a silver paste, or the like) is used at the time of bonding the lead frame 80 to the respective electrode wiring patterns. The p-electrode-side lead frame 82 and then-electrode-side lead frame 83 are bent in the shape of letter C so as to wrap around the substrate portion 41 of the sealing member 40 that is formed below the lead frame 80 and the sub-mounted substrate 30. In this respect, the substrate portion 41 corresponds to a substrate body 31A of the substrate 30A in a semiconductor light emitting device 10A that is another example to be described later. In the first embodiment, the lead frame 80 is bent into the shape of letter C, to thus make up a comparatively compact package. However, it is also possible to adopt another configuration that does not entail bending the lead frame 80, like so-called slug-type lead frame.

A method for manufacturing the semiconductor light emitting device 10 of the first embodiment is now described. In the first embodiment, explanations are given to a manufacturing method involving screen printing.

(Sealing Step)

Figure 3:
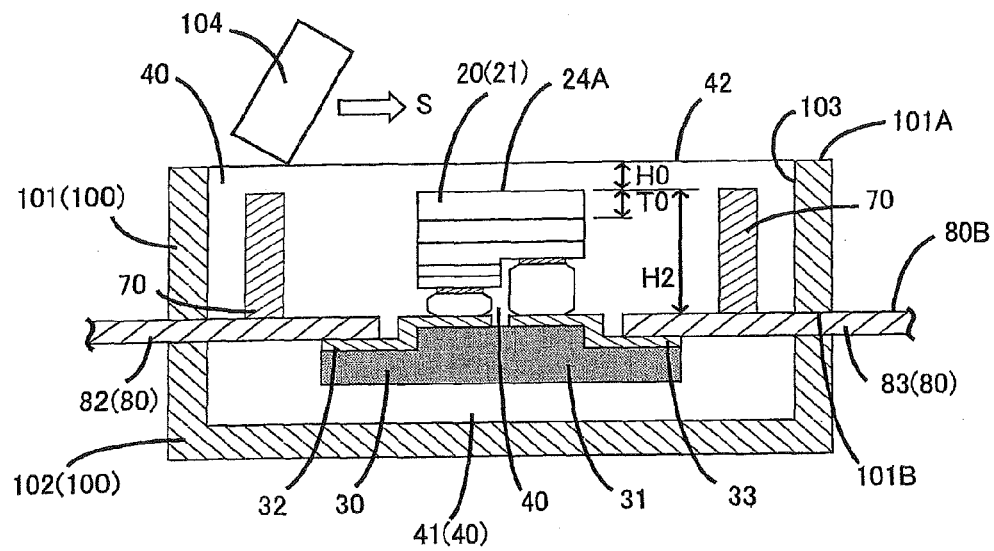
FIG. 3 is a cross sectional view of the semiconductor light emitting device of FIG. 1 that is in a sealing step (the first embodiment)

First, as shown in FIG. 3, the semiconductor chip 20 is fixed by way of the sub-mounted substrate 30, and the lead frame 80 to which the heat transfer member 70 is also bonded is sandwiched between an upper frame body 101 and a lower frame body 102. The semiconductor chip 20 is completely fitted in, without projection, a recess 103 of a frame body 100 that is made up of the upper frame body 101 whose top and bottom are open and the lower frame body 102 whose top is open and whose bottom is closed.

On this occasion, it is desirable to set a distance from an upper end surface 101A of the upper frame body 101 to an upper end surface 24A of the substrate 24 of the semiconductor chip 20 in consideration of an amount of contraction or expansion of the sealing member 40 occurred after the sealing member 40 has finished being cured in such a way that a dimension (an amount of sinking) H0 of the sealing member 40 acquired after being cured comes to about 10 micrometers to 200 micrometers and, more preferably, about 30 micrometers to 70 micrometers. The reason for this is that, when the dimension H0 is less than 10 micrometers, variations (in a range of the order of 20 micrometers) in dimension (height) H2 from an upper end surface 80B of the lead frame 80 (or a lower end surface 101B of the upper frame body 101) to the upper end surface 24A of the substrate 24 of the semiconductor chip 20 could not be completely absorbed at the time of the semiconductor chip 20 being fixed to the lead frame 80. If the dimension H0 exceeds 200 micrometers, an excessive operation time will be consumed by processing pertinent to the removal step to be described later. In the first embodiment, a target value of the dimension H0 is set to 50 micrometers. In this respect, all you need to do is to set the height of the heat transfer member 70 so as to become tantamount to the dimension H2 or more.

Next, a semisolid raw material of the sealing member 40 is poured to fill a space of the recess 103 by way of an upper opening of the upper frame body 101. An upper end surface 42 of the sealing member 40 is made smooth by use of a squeegee 104 so as to become flush with the upper end surface 101A of the upper frame body 101. Silica, or the like, is added to the semisolid raw material of the sealing member 40 in order to impart thixotropy to the raw material. The squeegee 104 moves along a moving direction S, or from left to right, on paper of FIG. 3. However, the moving direction S of the squeegee 104 is not limited particularly, so long as the upper end surface 42 of the sealing member 40 can be made smooth.

Subsequently, the thus-filled sealing member 40 is cured. In addition to natural cure entailing natural seasoning, an arbitrary method or material can also be adopted for curing the sealing member 40 according to an employed material by promoting seasoning and curing by heating and UV radiation or selection of a two-part curable (reactive cure) material for a material of the sealing member 40. Processing pertinent to a step of sealing the semiconductor chip 20 by means of the sealing member 40 is thus performed. A thermosetting resin is employed for a white resin that is to become the sealing member 40 in the first embodiment and, hence, the thermosetting resin is cured by heating.

In the sealing step, the sealing member 40 is formed so as to encompass a lower side of the chip body 21, the circumferences of the p-electrode 22 and the n-electrode 23, the circumferences of the conductive members 22A and 23A, the circumferences of the sub-mounted substrate 30, and a circumference of the lead frame 80 placed in the frame body 100 as well as to encompass an upper side and entire lateral sides of the chip body 21. In the first embodiment, the substrate portion 41 of the sealing member 40 that is formed below the lead frame 80 and the sub-mounted substrate 30 is formed in an integrated manner. However, this portion can also be taken as a separate member, and the separate member can be attached to the lead frame 80 and the sub-mounted substrate 30. A material of the separate member is not particularly restricted. However, use of a material that exhibits superior heat conductivity (a heat dissipation characteristic) is desirable.

(Removal Step and Irregularity Formation Step)

Figure 4:
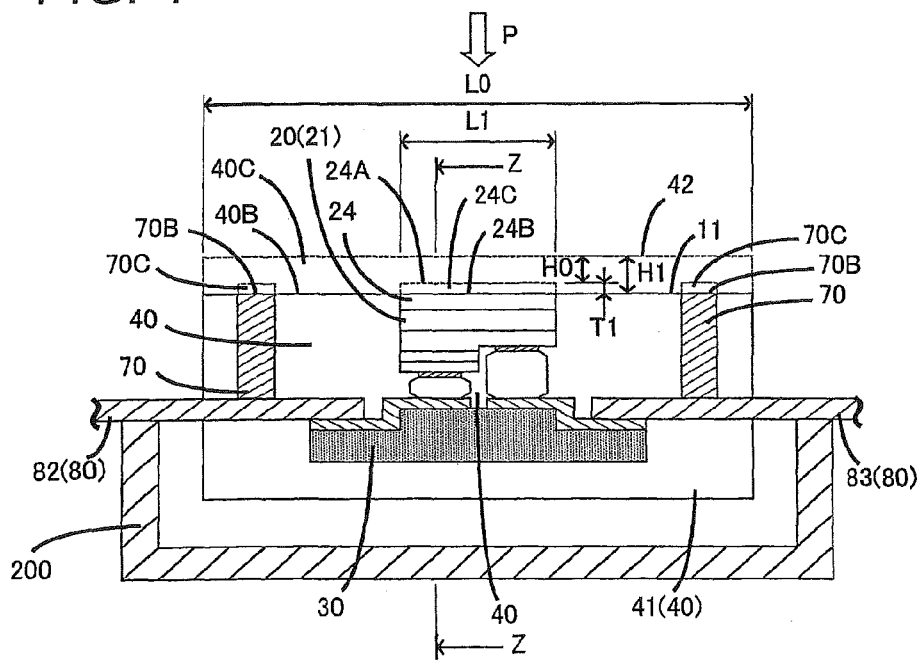
FIG. 4 is a cross sectional view of sealing the semiconductor light emitting device of FIG. 1 that is in a removal step (the first embodiment)

After the sealing member 40 has finished being cured, the frame body 100 is removed, and the lead frame 80 of the semiconductor light emitting device 10 that lies in a state of a semi-finished product is secured to a pedestal 200 as shown in FIG. 4. In FIG. 4, the pedestal 200 is illustrated as staying out of contact with the substrate portion 41 of the sealing member 40. However, the pedestal 200 can also be in contact with the substrate portion 41. Alternatively, some sort of spacer can also be interposed between the pedestal 200 and the substrate portion 41 of the sealing member 40. Further, the lower frame body 102 employed in the sealing step can also be used as a substitute for the pedestal 200.

In the removal step, an upper end portion 40C which is a redundant portion of the sealing member 40 is removed by grinding with use of a common grinder employed in grinding a semiconductor device. Further, an upper end portion 24C which is a redundant portion of the substrate 24 of the semiconductor chip 20 and an upper end portion 70C which is a redundant portion of the heat transfer member 70 are also removed by grinding.

During grinding operation, the upper end portion 40C is ground in excess of a lower end of the dimension H0 up to a lower end of the dimension H1 (the deepest level up to which the upper end portion is to be ground), thereby completely laying exposed an upper end bond surface 24B that is to be a surface of the substrate 24 out of the sealing member 40. A difference between the dimension H1 and the dimension H0 is a grind depth T1 for the substrate 24. In relation to the grind depth T1, it is desirable that the substrate 24 be ground by one micrometer or more in consideration of a state of irregularities to be described later. In the meantime, however, it is also desirable that the grind depth T1 should be kept at a maximum of the order of 50 micrometers so as to prevent excessive grinding of the substrate 24. For instance, when the dimension H0 is 200 micrometers, the minimum requirement is to set the dimension H1 to at least 211 micrometers or thereabouts in consideration of variations in dimension H2. However, as mentioned previously, setting the dimension H1 to a maximum of 250 micrometers or thereabouts is desirable so as to prevent excessive grinding of the substrate 24. In this respect, since an initial thickness T0 of the substrate 24 is generally at least about 500 micrometers. Therefore, even if the grind depth T1 is of the order of 50 micrometers, the substrate 24 is left to a thickness of about 450 micrometers.

In relation to machining conditions for the removal step, the number of revolutions of a spindle of the grinder is set to 500 to 1000 rpm or thereabouts, and the grind depth is set to about 0.1 to 0.5 micrometers/revolution, and a feed speed of a grinding stone is set to about 1 to 8 mm/sec. The conditions can be appropriately set in a range where no damage is inflicted on the semiconductor chip 20. A material of the grinding stone and surface hardness and roughness of the grinding stone can also be arbitrarily selected such that a desirable state of irregularities is obtained. However, in the first embodiment, the material of the grinding stone is diamond, and there is employed a grinding stone whose surface hardness is of 70 to 150 GPa and whose mean particle size ranges from nine to 15 micrometers.

Figure 5:
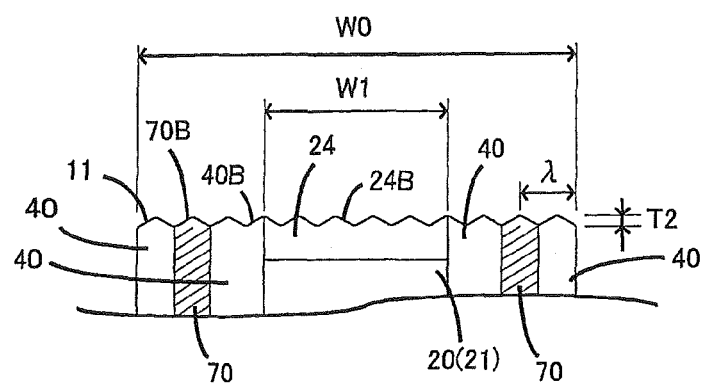
FIG. 5 is another partially enlarged cross section of the semiconductor light emitting device of FIG. 4 that is in the removal step (the first embodiment)

The removal step also doubles as an irregularity formation step. As illustrated in FIG. 5 that provides an enlarged cross sectional view taken along line Z-Z shown in FIG. 4, fine irregularities are formed in an upper end bond surface 40B of the sealing member 40 that is acquired after removal, the upper end bond surface 24B of the substrate 24 of the ground semiconductor chip 20, and an upper end bond surface 70B of the ground heat transfer member.

Desirable irregularities are those that conform to a wavelength of light emanating from the semiconductor chip 20. In the first embodiment, the light emanating from the semiconductor chip 20 is blue light whose wavelength is 450 nm to 460 nm. Hence, in relation to an index of surface roughness, irregularities are machined such that a length $\lambda$ of one irregularity comes to be a submicron in size. The most desirable state is that the irregularities assume a given length $\lambda$ and exhibit regularity in the same way as does a diffraction grating. However, it is also acceptable that an average length $\lambda$ of the irregularities conforms in size to the wavelength of light.

Alternatively, center line average roughness Ra is commonly, often used as an index of surface roughness. Therefore, it is difficult to strictly convert the index that uses the length $\lambda$. When the wavelength of light emanating from the semiconductor chip 20 is taken as 450 nm to 460 nm, acceptable center line average roughness Ra is about 0.5 micrometers to 1.0 micrometer. Accordingly, when the wavelength of light emanating from the semiconductor chip 20 is 450 nm to 460 nm, a required difference T2 of elevation among irregularities can be considered to fall at most within a range of 2.0 micrometers that is about twice the center line average roughness Ra. Therefore, it is desirable to set the grind depth T1 to at least 2.0 micrometers or more in order to lay the upper end bond surface 24B of the substrate 24 fully exposed.

In order to make the irregularities on the bond surface 11 much smoother, it is also acceptable to lay the upper end bond surface 24B of the substrate 24 fully exposed and grind the surface in a plurality of directions. As shown in FIG. 8, in the removal step, a rotating grinding stone, for example, is first reciprocally actuated along a direction of arrow K1 so as to run along a longitudinal direction of the sealing member 40 (in other words, along a direction of a length L0 in the longitudinal direction of the sealing member 40), to thus grind away the upper end portion 40C that is a redundant portion of the sealing member 40, the upper end portion 24C that is a redundant portion of the substrate 24 of the semiconductor chip 20, and the upper end portion 70C that is a redundant portion of the heat transfer member 70 and consequently lay the upper end bond surface 24B of the substrate 24 fully exposed. Subsequently, in the irregularity formation step, the rotating grinding stone is reciprocally actuated along directions of arrow K2, arrow K3 and arrow K4 that all differ from the direction of arrow K1, thereby forming irregularities. The arrow K2 is a 45-degree turn in a rightward direction (in other words, a counterclockwise direction) with respect to a direction of the arrow K1; the arrow K3 is a 90-degree right turn; and the arrow K4 is a 135-degree right turn. An allowable range of variations in each of the arrow K1, the arrow K2, the arrow K3, and the arrow K4 is allowance of plus or minus 5 degrees, or thereabouts, with reference to an intended direction. In the irregularity formation step, the grinding stone does not always need to be reciprocally actuated in the four directions of arrows K1 to K4. The grinding stone can also be actuated limitedly in any one of the directions; namely, in either an outgoing direction or a returning direction. Reciprocally actuating the grinding stone one to five times in one direction is desirable. Reciprocally actuating the grinding stone a few times is more desirable. Alternatively, a processing sequence of arrow K1, arrow K2, arrow K3, and arrow K4 can also be arbitrarily shuffled. Further, one processing sequence can be taken as one set, and the set can also be iterated a number of times. Moreover, processing oriented in a direction that differs from the directions of arrows K1 to K4 can also be added. In the first embodiment, a plurality of processing directions are accomplished by adopting the four different directions of arrows K1 to K4. However, processing can also be performed in a number of directions by adopting at least two different directions. In that case, selecting two directions that are orthogonal to each other, like the arrows K1 and K3, is desirable. Further, the arrow K1 along the longitudinal direction of the sealing member 40 does not always need to be set and can also be arbitrarily set. Furthermore, grinding can also be continuously performed from the removal step in the plurality of directions.

After irregularities are formed in the semiconductor light emitting device 10 that stays in a semi-finished state, the semi-finished semiconductor light emitting device 10 is cleansed in purified water and subjected to an air blow, to thus remove resultant chippings. The bond surface 11 that is made up of the upper bond surface 40B of the sealing member 40, the upper end bond surface 24B of the substrate 24 of the semiconductor chip 20, and the upper end bond surface 70B of the heat transfer member and to which the wavelength conversion member 60 is to be attached is thereby formed; and fine irregularities are simultaneously formed in the bond surface 11, whereby the bond surface 11 is roughened.

In the first embodiment, both processing pertinent to the removal step and processing pertinent to the irregularity formation step are implemented by single grinding operation. However, if the substrate 24 of the semiconductor chip 20 is formed from sapphire because of not great necessity to take into account the cost of manufacture of the semiconductor light emitting device 10, the bond surface 11 in which the upper end bond surface 24B of the substrate 24 remains exposed can be initially formed in the removal step in which slicing entailing irradiation of a laser beam is performed. Subsequently, fine irregularities can be formed in the bond surface 11 by way of the irregularity formation step involving grinding or abrasion. Yet, even when the substrate 24 of the semiconductor chip 20 is formed from gallium nitride, processing pertinent to the irregularity formation step can be performed by etching unless there is great necessity to take into account the cost of manufacture of the semiconductor light emitting device 10 in the same way as mentioned previously.

(Bonding Step)

In the bonding step, the wavelength conversion member 60 is bonded, by way of the coupling member 50, to the semi-finished semiconductor light emitting device 10 that has finished undergoing formation of irregularities. A common way employed at the time of bonding operation is to apply an adhesive that serves as the coupling member 50 to the bond surface 11 of the semi-finished semiconductor light emitting device 10, thereby affixing the wavelength conversion member 60 to the bond surface 11. However, another adoptable way is to apply an adhesive that serves as the coupling member 50 to the wavelength conversion member 60 and affix the surface coated with the coupling member 50 to the bond surface 11 of the semi-finished semiconductor light emitting device 10. An arbitrary method, like screen printing and dispensing, can also be adopted as a method for applying the adhesive that serves as the coupling member 50. During the bonding operation, curing the adhesive that serves as the coupling member 50 can also be promoted by pressing or pressurizing the wavelength conversion member 60 to the semi-finished semiconductor light emitting device 10. Although it is un-illustrated, another mode can also be adopted from the viewpoint of enhancement of light extraction performance. Namely, another transparent layer that is different from the coupling member 50 can previously be formed at a location on the upper end bond surface 24B of the semiconductor chip 20 (the bond surface 11), thereby forming the coupling member 50 at a location on the bond surface 11 that corresponds to a circumference of the upper end bond surface 24B (the bond surface 11). The transparent layer can be any layer, so long as the layer has a refractive index whose numerical value ranges from a numerical value of a refractive index of the member making up the wavelength conversion member 60 to a numerical value of a refractive index of a member making up the upper end bond surface 24B of the semiconductor chip 20. Further, the transparent layer can be clear and colorless. However, the minimum requirement for the transparent layer is that light whose wavelength corresponds to emissions from the semiconductor chip 20 can pass through the transparent layer. Moreover, it is also desirable that the transparent layer also be made of a material which exhibits superior heat conductivity tantamount to or larger than that of the coupling member 50.

Although un-illustrated, another bonding way can also be adopted as another bonding technique. Namely, the wavelength conversion member 60 is directly formed on the semi-finished semiconductor light emitting device 10 by means of sputtering or screen printing. The technique makes it possible to obviate the adhesive that serves as the coupling member 50. However, although the step is not a bonding step to be exact, the wavelength conversion member 60 comes into close contact with the bond surface 11 having the fine irregularities, and the gist of the invention exactly lies in this point. Hence, such a technique shall be included in the bonding step. Under the technique, fine irregularities are spontaneously formed in the wavelength conversion member 60 that is contiguous to the bond surface 11, which is also preferable in view of enhancement of light extraction performance. In this regard, from the viewpoint of enhancement of light extraction performance, there can also be adopted, at the time of use of the bonding technique, a mode in which a transparent layer, such as that mentioned previously, is formed in advance separately from the coupling member 50 at a location on the upper end bond surface 24B of the semiconductor chip 20 (the bond surface 11). Alternatively, from the viewpoint of enhancement of adhesion between the semiconductor chip 20 and the wavelength conversion member 60, there can also be adopted a mode in which the foregoing coupling member 50 is previously applied to the location on the upper end bond surface 24B of the semiconductor chip 20 (the bond surface 11).

(Separation Step)

The lead frame 80 is formed in a state in which a plurality of lead frames 80 are connected lengthwise and crosswise. Since one semiconductor chip 20 is implemented on one lead frame 80, the lead frames 80 are separated from each other by use of a technique, such as dicing, whereby the semiconductor light emitting devices 10 are divided from each other. The lead frame 80 of the thus-separated semiconductor light emitting device 10 is bent in the form of letter C so as to be coiled around the substrate portion 41 of the sealing member 40, whereupon the semiconductor light emitting device 10 is completed.

In contrast with the manufacturing methods described in connection with JP-A-2010-157638 and JP-A-2012-124485, under the method for manufacturing the semiconductor light emitting device 10 of the invention, the wavelength conversion member 60 covers the semiconductor chip 20, as well as stretching up to the region of the sealing member 40. Therefore, an area coated with the adhesive that serves as the coupling member 50 (i.e., a contact area) increases, thereby enhancing adhesion of the wavelength conversion member 60 to the bond surface 11 formed from the semiconductor chip 20 and the sealing member 40. Thus, the wavelength conversion member 60 becomes less likely to peel off.

For example, in the case of a configuration, such as that described in connection with JP-A-2010-157638, the area coated with an adhesive that serves as the coupling member 50 comes to be only the area of the upper end bond surface 24B of the semiconductor chip 20 (i.e., a product of a longitudinal length L1 and a lateral length W1 of the semiconductor chip 20). In the meantime, in the semiconductor light emitting device 10 of the invention, the area coated with the adhesive that serves as the coupling member 50 increases up to an area which is tantamount to that of the bond surface 11 (a product of the longitudinal length L0 and the lateral length W0 of the sealing member 40). In connection with the configuration of the first embodiment, let L0=3.8 mm, W0=1.4 mm, L1=700 micrometers, and W1=390 micrometers, the area of the bond surface 11 becomes about 20 times as large as the area of the upper end bond surface 24B of the semiconductor chip 20.

Moreover, the area (the contact area) coated with the adhesive that serves as the coupling member 50 substantially increases further as a result of the bond surface 11 being roughened by formation of fine irregularities, thereby enhancing adhesion to a much greater extent. In connection with the configuration of the first embodiment, let a difference of elevation T2=1 micrometer and a length λ=450 nm, the area becomes almost double per unit area. Hence, when the thus-doubled area and the 20-times area are summed, the area is increased about 40 times.

Moreover, the wavelength conversion member 60 is bonded to the area of the sealing member 40 through which heat hardly travels, so that degradation of the adhesive serving as the coupling member 50, which would otherwise be caused by heat in that area, is inhibited. Even if only the area of the bond surface 11 corresponding to the semiconductor chip 20 peels off from an interface between the bond surface 11 and the wavelength conversion member 60 under the influence of heat, the wavelength conversion member 60 will be held by the adhesive applied on the sealing member 40. Therefore, degradation of light emission performance of the semiconductor light emitting device 10 is accordingly inhibited.

Further, as a result of the bond surface 11 being roughened, light, which would otherwise travel toward the inside of the semiconductor chip 20 upon reflection on the interface with the roughened surface, is blocked in the semiconductor chip 20, whereby the efficiency in extraction of light to the outside of the semiconductor chip 20 is enhanced. Further, since processing is carried out in such a way that the length λ comes to be submicron in size, light is intensively extracted from the upper end bond surface 24B of the semiconductor chip 20 at a location immediately below the wavelength conversion member 60. Hence, further enhancement of an orientation characteristic is effected, and reflection of light that travels toward the inside of the semiconductor chip 20 is additionally inhibited. Re-absorption of reflected light, which would otherwise occur in the semiconductor chip 20, is inhibited further, and hence light extraction efficiency is further enhanced. The bond surface 11 is ground in a plurality of directions when being roughened. Variations in length λ are inhibited much greater, so that efficiency in extraction of light to the outside of the semiconductor chip 20 is enhanced to a much greater extent.

Further, the sealing member 40 can also double as a housing (package) of the semiconductor light emitting device 10. Extra steps for inserting an assembly made up of the semiconductor chip 20 and the wavelength conversion member 60 into a housing (package) can be obviated, whereby the cost of manufacture of the semiconductor light emitting device 10 is curtailed.

(Second Embodiment)
(Another Example of the Sealing Step)

The first embodiment provides explanations about a manufacturing method using screen printing that enables inexpensive manufacture of a semiconductor light emitting device in a comparatively simple manner. However, another example, which will be described later, can also be used in connection with the sealing step.

Figure 6:
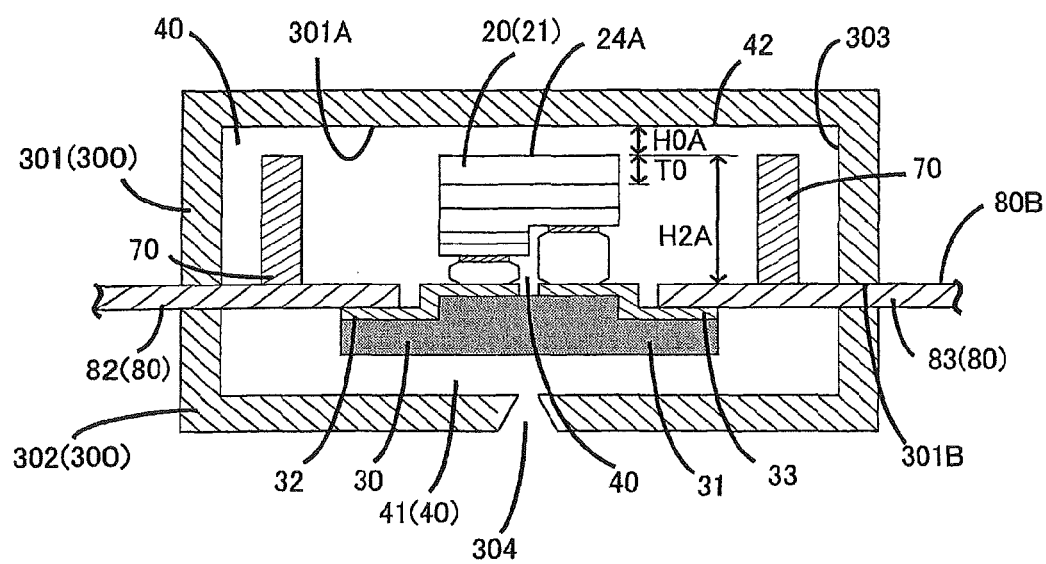
FIG. 6 is a cross sectional view showing the semiconductor light emitting device of FIG. 1 that is in another sealing step (a second embodiment)

FIG. 6 shows, as a second embodiment, a case using injection molding in place of screen printing descried in connection with the first embodiment. The lead frames 80 to which the semiconductor chips 20 are fixed by way of the sub-mounted substrate 303 are sandwiched between an upper metal mold 301 and a lower metal mold 302. The semiconductor chips 20 are fully fitted in respective cavities 30 of a die assembly 300 that is made up of the upper metal mold 301 and the lower metal mold 302.

On this occasion, it is desirable that a distance from a cavity upper end surface 301A of the upper metal mold 301 to the upper end surface 24A of the substrate 24 of the semiconductor chip 20 be set in consideration of an amount of expansion or contraction of the sealing member 40 that will occur after being cured such that a dimension H0A of the sealing member 40 (i.e., an amount of sinking) acquired after having finished being cured comes to 10 micrometers to 200 micrometers, or thereabouts. More preferably, the distance should be set to 30 micrometers to 70 micrometers or thereabouts. The reason for it is that, when the dimension H0A is less than 10 micrometers, variations (in a range of the order of 20 micrometers) in dimension (height) H2A from the upper end surface 80B of the lead frame 80 (or a lower end surface 301B of the upper metal mold 301) to the upper end surface 24A of the substrate 24 of the semiconductor chip 20 could not be completely absorbed at the time of the semiconductor chip 20 being fixed to the lead frame 80. If the dimension H0A exceeds 200 micrometers, an excessive operation time will be consumed by processing pertinent to the removal step to be described later. A target value of the dimension H0A is set to 50 micrometers. In this respect, the cavity upper end surface 301A of the upper metal mold 301 forms the upper end surface 42 of the sealing member 40 by injection molding.

Next, a molten raw material of the sealing member 40 is poured from a gate 304 so as to fill the cavity 303 by means of injection molding, and the raw material is then solidified by cooling. After solidification of the sealing member 40 is completed, the die assembly 300 is opened, whereby the semi-finished semiconductor light emitting device 10 is taken out. Processing pertinent to the step of sealing the semiconductor chip 20 with the sealing member 40 can thus be performed by means of injection molding. A great difference does not exist between injection molding and screen printing in terms of the ability to comparatively, easily manufacture the semiconductor light emitting device. However, an injection molding machine is superior as a molding facility to a screen printer in view of versatility. For this reason, there is yielded an advantage of joint use of the manufacturing facility for another semiconductor device that does not entail grinding.

(Third Embodiment)

Although un-illustrated, the sealing member 40 can also be formed as another example of the sealing step, or a third embodiment, by means of potting. In the case of potting, the same procedures as those used in screen printing are followed to form the sealing member 40 partway. However, the raw material of the sealing member 40 is not made smooth by the squeegee 104. A wait is required instead until the upper end surface 42 of the sealing member 40 is made uniform under its own weight of the raw material of the sealing member 40 and until the sealing member 40 becomes cured. After solidification of the sealing member 40 is completed, the frame bodies are removed, to thus let the semi-finished semiconductor light emitting device 10 out. Processing pertinent to the step of sealing the semiconductor chip 20 with the sealing member 40 can also be thus performed by potting. Although potting involves consumption of a slightly longer time than do screen printing and injection molding because the upper end surface 42 of the sealing member 40 is made smooth. However, potting is lower than screen printing and injection molding in terms of a degree of technical difficulty encountered in manufacture. For this reason, potting is superior to screen printing and injection molding in terms of convenience.

(Another Example of the Semiconductor Light Emitting Device)

A configuration of a semiconductor light emitting device 10A is next described as another example of the semiconductor light emitting device 10.

(Entire Semiconductor Light Emitting Device 10A)

Figure 7:
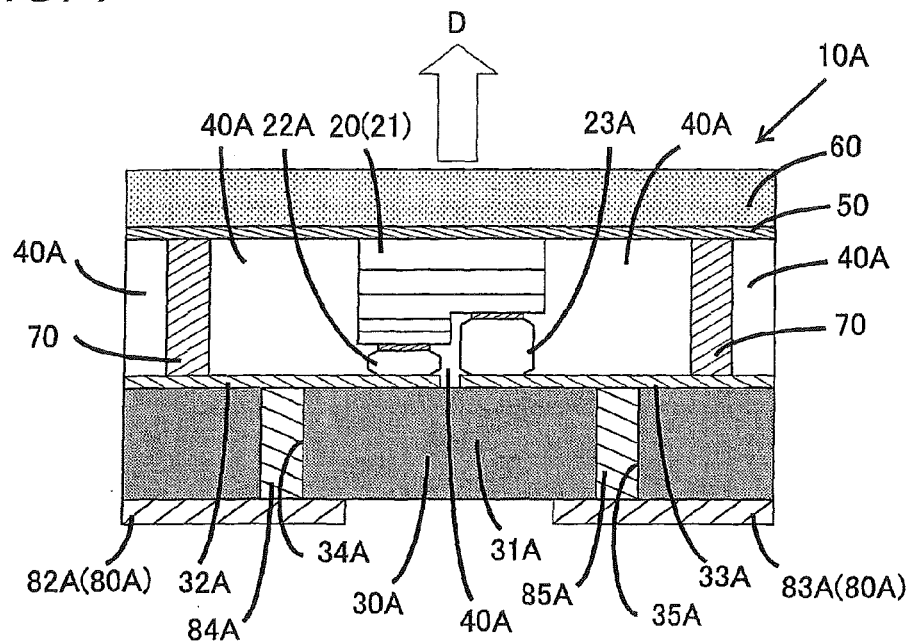
FIG. 7 is a cross sectional view of another semiconductor light emitting device manufactured by the invention (another modification)

As shown in FIG. 7, the semiconductor light emitting device 10A is different from the semiconductor light emitting device 10 of the first embodiment in that the substrate 30A is used in lieu of the sub-mounted substrate 30 and that a lead frame 80A and the sealing member 40 each incidentally have different configurations. Therefore, explanations are given primarily to the differences with respect to the semiconductor light emitting device 10, and explanations about the similar portions are omitted.

(Substrate 30A)

The substrate 30A requires that the substrate body 31A be made of an insulator, like ceramic. A material that exhibits superior heat conductivity is desirable as a material for the substrate body 31A. In paper of FIG. 7, a p-electrode wiring pattern 32A and an n-electrode wiring pattern 33A are formed on an upper side of the substrate body 31A. The p-electrode wiring pattern 32A and the n-electrode wiring pattern 33A are separated from each other so as to avoid an electrical short circuit.

The p-electrode wiring pattern 32A is connected to a p-electrode-side lead frame 82A by way of a conductive member 84A. The n-electrode wiring pattern 33A is connected to an n-electrode-side lead frame 83A by way of a conductive member 85A. The conductive member 84A is provided in a via hole 34A opened in the substrate body 31A, and the conductive member 85A is provided in a via hole 35A opened in the substrate body 31A.

(Sealing Member 40A)

In the paper of FIG. 7, as in the case with the semiconductor light emitting device 10 a sealing member 40A is not formed at a location (in other words, an area occupied by the substrate 30A) below the p-electrode wiring pattern 32A and the n-electrode wiring pattern 33A that are opposite to a direction D in which the semiconductor light emitting device 10A primarily emanates light. However, the sealing member 40A is formed so as to encompass the lower side of the chip body 21, the circumferences of the p-electrode 22 and the n-electrode 23, and the circumferences of the conductive members 22A and 23A as well as to encompass the entire side surfaces of the chip body 21.

(Lead Frame 80A)

The lead frame 80A is a plate-like member formed from a conductive material that is made by plating a copper alloy or an iron alloy, which exhibits superior heat dissipation. A portion of the lead frame 80A is laid exposed out of an exterior surface of the semiconductor light emitting device 10A. Heat is dissipated directly to the outside of the semiconductor light emitting device 10A. In the lead frame 80A, the p-electrode-side lead frame 82A and the n-electrode-side lead frame 83A are not bent so as to be wrapped around the substrate 30A and are placed below the substrate 30A in a plate shape without modifications. However, the p-electrode-side lead frame 82A and the n-electrode-side lead frame 83A are separated from each other so as to avoid an electrical short circuit. The lead frame 80A is also formed in such a way that the plurality of lead frames 80A, are connected lengthwise and crosswise. One semiconductor chip 20 is implemented on the substrate 30A outfitted with one lead frame 80A by way of the p-electrode wiring pattern 32A and the n-electrode wiring pattern 33A. The lead frame 80A is separated by means of a technique, such as dicing, whereupon the semiconductor light emitting devices 10A are separated into individual pieces. Thus, the semiconductor light emitting devices 10A are completed. Although FIG. 7 illustrates a state in which a dicing margin is removed from the lead frame 80A. However, the dicing margin can also be left.

(Another Example of the Semiconductor Light Emitting Device 10A)

Explanations are given to a mode of the semiconductor light emitting device 10A in which the substrates 30A are previously fabricated for the plurality of lead frames 80A, respectively. However, there can also be adopted a substrate; namely, the substrates 30A themselves are fabricated while being interconnected lengthwise and crosswise in the same way as are the lead frames 80A. In this case, a dicing margin of the substrates 30A can also be eliminated or left.

The invention has provided the descriptions about the method for manufacturing the semiconductor light emitting devices of the respective embodiments by means of flip-chip bonding. Further, the embodiments of the invention also provide the descriptions about the configurations in which one semiconductor light emitting device has one semiconductor chip. However, the semiconductor light emitting device to which the invention can apply is not limited to the configurations. The invention can also apply to a semiconductor light emitting device that has a plurality of semiconductor chips. In this regard, in the case of a semiconductor light emitting device having a plurality of semiconductor chips, it is desirable to adopt a configuration in which a distance among the semiconductor chips is set so as to inhibit occurrence of self-absorption of light emanating from the respective semiconductor chips, which would otherwise occur in the semiconductor chips, and in which the sealing member 40 is interposed between the semiconductor chips.

What is claimed is:

1. A method for manufacturing a semiconductor light emitting device, the method comprising:
    sealing a semiconductor chip fixed on a lead frame with a sealing member;
    removing the sealing member until a surface of the semiconductor chip becomes exposed;
    forming fine irregularities on a bond surface formed in the removing; and
    bonding a wavelength conversion member to the bond surface,
    wherein the bond surface is ground in a plurality of directions in the forming fine irregularities.

2. The method for manufacturing a semiconductor light emitting device according to claim 1,
    wherein the removing doubles as the forming.

3. The method for manufacturing a semiconductor light emitting device according to claim 1,
    wherein, in the bonding, the wavelength conversion member is bonded to the bond surface such that the wavelength conversion member covers the semiconductor chip and extends up to a region of the sealing member.

4. The method for manufacturing a semiconductor light emitting device according to claim 1, wherein, in the bonding, the wavelength conversion member is bonded to the bond surface such that the wavelength conversion member covers the semiconductor chip and extends up to a region of the sealing member whereby a contact area of the bond surface with the wavelength conversion member increases.

5. The method for manufacturing a semiconductor light emitting device according to claim 1, wherein the sealing member doubles as a housing of the semiconductor light emitting device.

6. A method for manufacturing a semiconductor light emitting device, the method comprising:
    sealing a semiconductor chip fixed on a lead frame with a sealing member;
    removing the sealing member until a surface of the semiconductor chip becomes exposed;
    forming fine irregularities on a bond surface formed in the removing; and
    bonding a wavelength conversion member to the bond surface,
    wherein the fine irregularities are formed so as to conform to a wavelength of light emanating from the semiconductor chip.

7. A method for manufacturing a semiconductor light emitting device, the method comprising:
    sealing a semiconductor chip fixed on a lead frame with a sealing member;
    removing the sealing member until a surface of the semiconductor chip becomes exposed;
    forming fine irregularities on a bond surface formed in the removing; and
    bonding a wavelength conversion member to the bond surface,
    wherein the removing comprises grinding the sealing member so as to expose a height of the semiconductor chip between 1 to 50 microns.

8. A method for manufacturing a semiconductor light emitting device, the method comprising:
    sealing a semiconductor chip fixed on a lead frame with a sealing member;
    removing the sealing member until a surface of the semiconductor chip becomes exposed;
    forming fine irregularities on a bond surface formed in the removing; and bonding a wavelength conversion member to the bond surface, wherein the bond surface includes an upper end bond surface of the sealing member and an upper end bond surface of the semiconductor chip.

9. A method for manufacturing a semiconductor light emitting device, the method comprising:

sealing a semiconductor chip fixed on a lead frame with a sealing member;

removing the sealing member until a surface of the semiconductor chip becomes exposed;

forming fine irregularities on a bond surface formed in the removing; and bonding a wavelength conversion member to the bond surface, wherein the fine irregularities are formed such that light transmitted towards an inside of the semiconductor chip is blocked.

* * * * *